United States Patent
Kamal et al.

(10) Patent No.: US 6,670,241 B1
(45) Date of Patent: Dec. 30, 2003

(54) SEMICONDUCTOR MEMORY WITH DEUTERATED MATERIALS

(75) Inventors: Tazrien Kamal, San Jose, CA (US); Arvind Halliyal, Cupertino, CA (US); Minh Van Ngo, Fremont, CA (US); Mark T. Ramsbey, Sunnyvale, CA (US); Jean Y. Yang, Sunnyvale, CA (US); Hidehiko Shiraiwa, San Jose, CA (US); Rinji Sugino, San Jose, CA (US)

(73) Assignees: Advanced Micro Devices, Inc., Sunnyvale, CA (US); Fujitsu Limited, Kanagawa-Ken (JP)

( * ) Notice: Subject to any disclaimer, the term of this patent is extended or adjusted under 35 U.S.C. 154(b) by 0 days.

(21) Appl. No.: 10/128,771

(22) Filed: Apr. 22, 2002

(51) Int. Cl.$^7$ ............................................. H01L 21/336
(52) U.S. Cl. ....................................................... 438/258
(58) Field of Search ......................................... 438/258

(56) References Cited

U.S. PATENT DOCUMENTS 6,218,245 B1 * 4/2001 Xiang et al. ................. 438/258
6,534,809 B2 * 3/2003 Moise et al. ................. 257/295

* cited by examiner

*Primary Examiner*—David Nelms
*Assistant Examiner*—Thao Le
(74) *Attorney, Agent, or Firm*—Mikio Ishimaru

(57) ABSTRACT

A device and method for manufacturing thereof for a MirrorBit® Flash memory includes providing a semiconductor substrate and successively depositing a first insulating layer, a charge-trapping layer, and a second insulating layer. First and second bitlines are implanted and wordlines are formed before completing the memory. Spacers are formed between the wordlines and an inter-layer dielectric layer is formed over the wordlines. One or more of the second insulating layer, wordlines, spacers, and inter-layer dielectric layers are deuterated, replacing hydrogen bonds with deuterium, thus improving data retention and substantially reducing charge loss.

8 Claims, 3 Drawing Sheets

SEMICONDUCTOR MEMORY WITH DEUTERATED MATERIALS

BACKGROUND OF THE INVENTION

1. Technical Field

The present invention relates generally to semiconductor technology and data retention in semiconductor memories.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents, without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

A major problem with the MirrorBit architecture has been discovered where the charges, which represent bits of data, tend to drain away over time through the semiconductor device leading to poor data retention. Hydrogen in the region of the charge-trapping dielectric layer acts as a carrier for the electrical charge. Hydrogen is present in the region as a result of the processes used at the back end of the line to produce various layers. Many materials used have silicon-hydrogen bonds, which are relatively weak and tend to break, thus leaving large amounts of hydrogen free to act as charge carriers.

A solution to this problem has been long sought but has long eluded those skilled in the art.

DISCLOSURE OF THE INVENTION

The present invention provides a manufacturing method for a MirrorBit® Flash memory and includes providing a semiconductor substrate and successively depositing a first insulating layer, a charge-trapping layer, and a second insulating layer. First and second bitlines are implanted and wordlines are formed before completing the memory. Spacers are formed between the wordlines and an inter-layer dielectric layer is formed over the wordlines. One or more of the second insulating layer, wordlines, spacers, and inter-layer dielectric layer are deuterated, replacing hydrogen bonds with deuterium, thus improving data retention and substantially reducing charge loss.

The present invention also provides a MirrorBit® Flash memory including a semiconductor substrate with a first insulating layer, charge-trapping layer, and a second insulating layer deposited thereon. First and second bitlines are implanted and wordlines are formed over the second insulating layer. Spacers are formed between the wordlines and an inter-layer dielectric layer is formed over the wordlines. One or more of the second insulating layer, wordlines, spacers, and inter-layer dielectric layer are deuterated, replacing hydrogen bonds with deuterium, thus improving data retention and substantially reducing charge loss.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
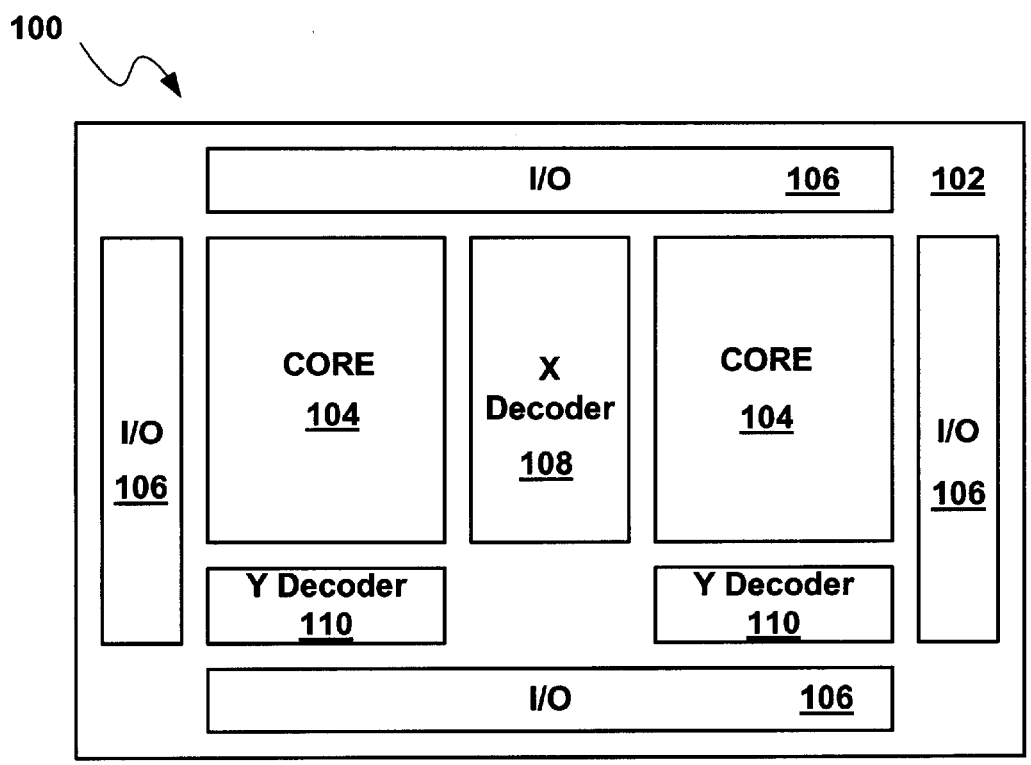
FIG. 1 is a plan view of a conventional MirrorBit Flash EEPROM.

Referring now to FIG. 1, therein is shown a plan view of a MirrorBit® Flash EEPROM 100, which commonly includes a semiconductor substrate 102 in which one or more high-density core regions and one or more low-density peripheral portions are formed. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
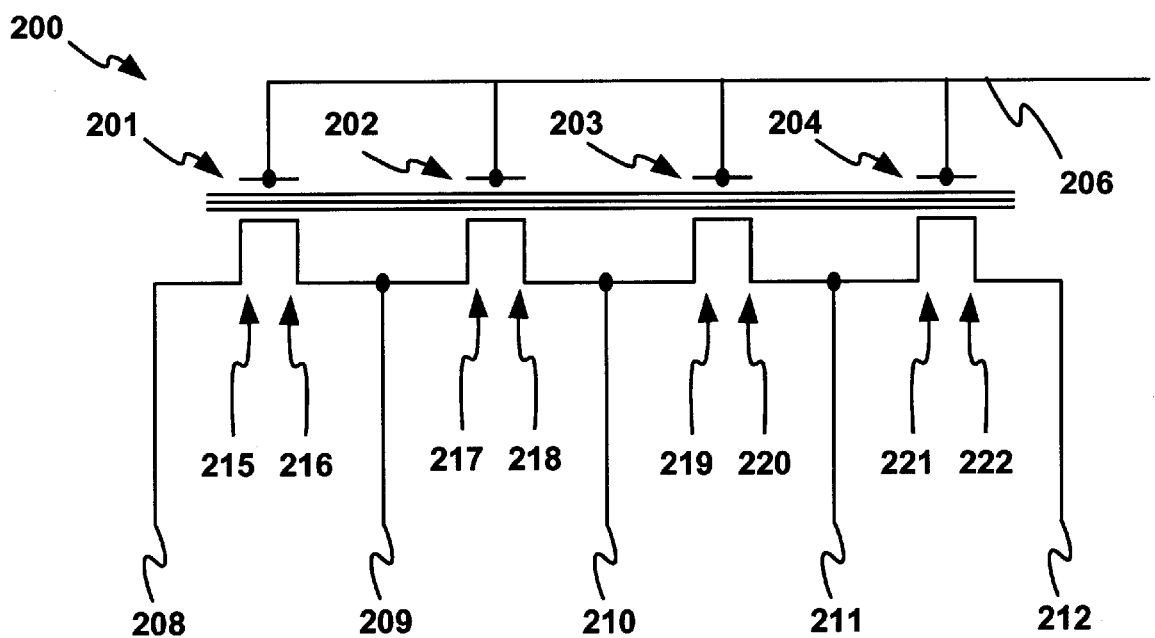
FIG. 2 is a circuit schematic of a portion of one of the M×N array cores of FIG. 1.

Referring now to FIG. 2, therein is shown a circuit schematic of a portion of one of the M×N array cores 104 of FIG. 1. The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
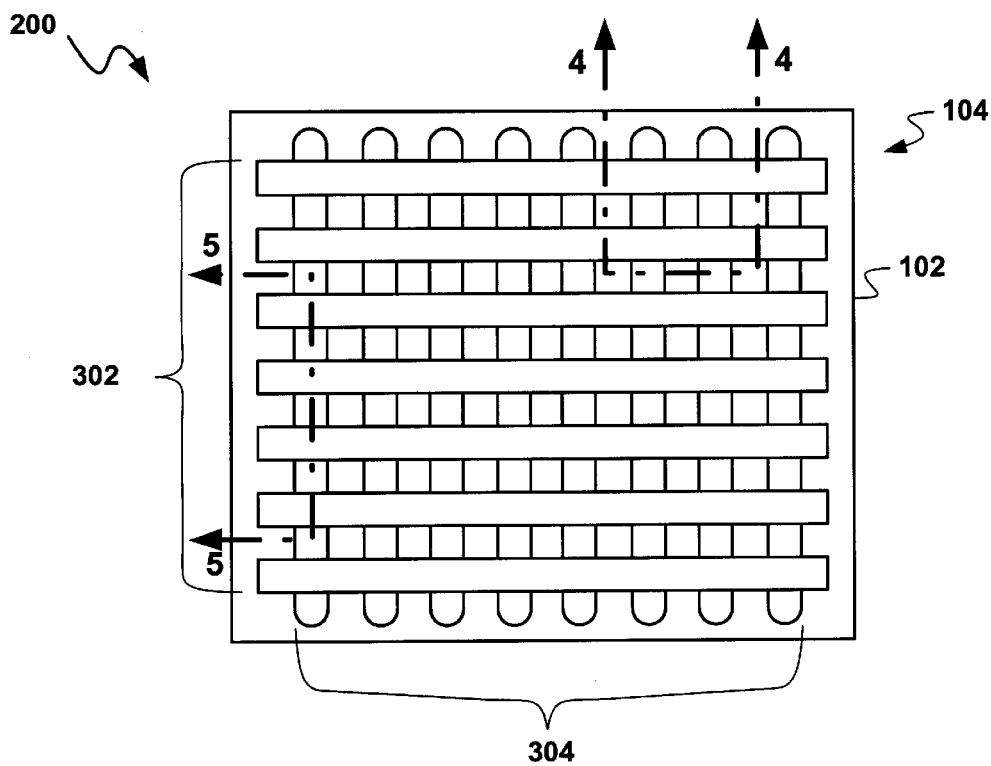
FIG. 3 is a plan view of a portion of one of the M×N array cores 104 of FIG. 1. including deuterated wordlines.

Referring now to FIG. 3, therein is shown a plan view of a portion of one of the M×N array cores 104 of FIG. 1. The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to the programming circuitry represented in part by x-decoders 108 and y-decoders 110 of FIG. 1.

As noted earlier, a major problem with the MirrorBit architecture has been discovered where the charges, which represent bits of data, tend to drain away over time through the semiconductor device leading to poor data retention. It has been discovered that hydrogen in the region of the charge-trapping dielectric layer cart give rise to programmed charge loss. Hydrogen is present in the region as a result of the processes used at the back end of the line to produce various layers of the integrated circuit. Many materials used in these structures have silicon-hydrogen bonds, which are relatively weak and tend to break, thus leaving large amounts of dangling bonds that can trap charges and then de-trap them very easily during the post cycle bake.

It has been discovered that deuterium acts differently from hydrogen in that it forms stronger bonds with materials such as silicon. Therefore it is ideal for use in integrated circuits.

In one embodiment, the wordlines 302 are composed of a polysilicon material and are "deuterated" which deuterium (D2), which means that a substantial portion of the silicon-hydrogen bonds have been replaced with stronger silicon-deuterium bonds, which are less likely to break, thus improving data retention.

Materials can be deuterated using a number of different deuterating processes such as a high-density plasma (HDP) deposition, rapid thermal chemical vapor deposition (RTCVD), low pressure chemical vapor deposition (LPCVD), rapid thermal oxidation (RTO), or by annealing in deuterium gas. The materials can be deuterated before or after deposition or in situ. It is also possible to cause deuteration due to diffusion during the normal manufacturing processing of the integrated circuit, which contains the memory cell.

Figure 4:
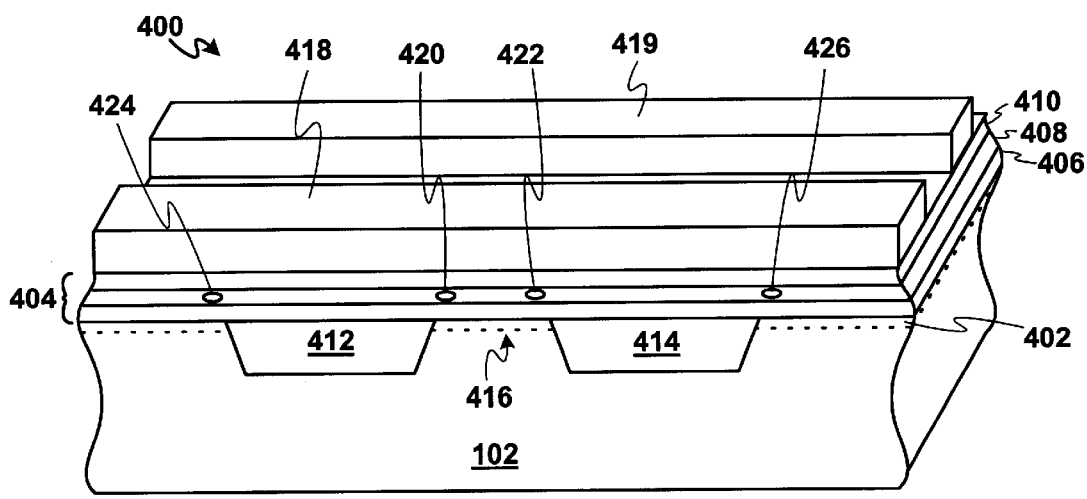
FIG. 4 is a cross-sectional isometric view of a typical MirrorBit Flash memory cell along the line 4—4 of FIG. 3 including a deuterated second insulating layer.

Referring now to FIG. 4, therein is shown a cross-sectional isometric view of a typical MirrorBit Flash memory cell along the line 4—4 of FIG. 3, such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide (SiO₂) and the charge-trapping layer 408 is of a nitride dielectric such as silicon nitride (Si$_x$N$_y$). The oxide-nitride-oxide configuration is frequently referred to as a matter of convenience as an "ONO layer". It will be noted that the present invention is not limited to specific dielectric or charge-trapping materials.

In one embodiment, the first insulating layer 406, composed of an oxide dielectric such as silicon dioxide, is deuterated. As with the deuterated wordlines 302 in FIG. 3, deuterating the first insulating layer 406 replaces silicon-hydrogen bonds with stronger silicon-deuterium bonds, which are less likely to break and result in charge loss, thus improving data retention.

In another embodiment, the second insulating layer 410, composed of an oxide dielectric such as silicon dioxide, is deuterated. As with the deuterated wordlines 302 in FIG. 3, deuterating the second insulating layer 410 replaces silicon-hydrogen bonds with stronger silicon-deuterium bonds, which are less likely to break and result in charge loss, thus improving data retention.

The bitlines 304 of FIG. 3 are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3.

It is understood that the implementation of each step in manufacturing has associated processing steps.

The locations 420 through 422 indicate where bits can be stored in the memory cell 400 and locations 424 and 426 are adjacent locations, which are independent of the memory cell 400.

Figure 5:
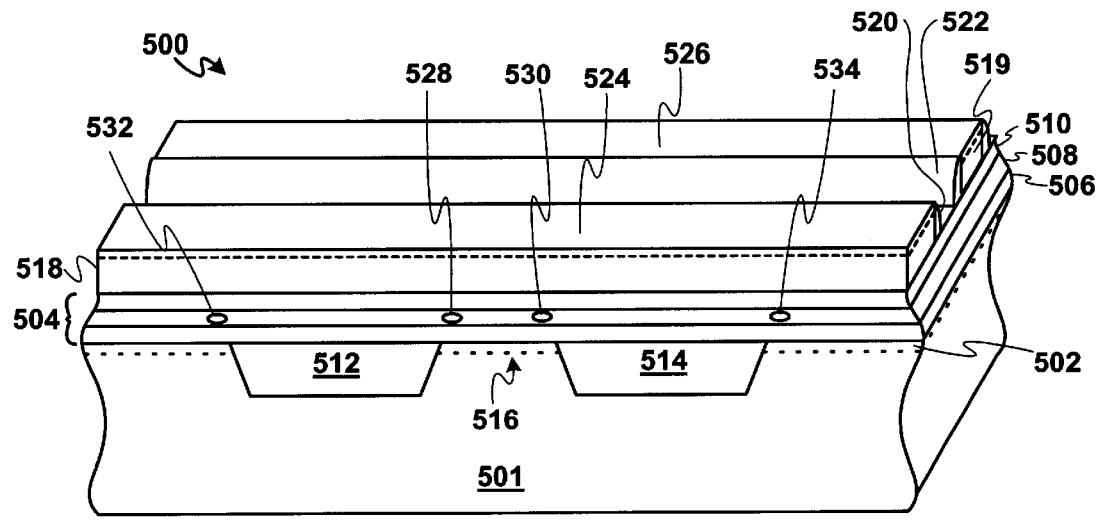
FIG. 5 is, a cross-sectional view of a partially processed memory cell similar FIG. 4 including deuterated spacers.

Referring now to FIG. 5, therein is shown a cross-sectional view of a partially processed memory cell similar to FIG. 4, such as a memory cell 500 according to the present invention. A semiconductor substrate 501 is a p-doped silicon substrate with a threshold adjustment implant 502 of a p-type material, such as boron. The threshold adjustment implant 502 provides a region that is more heavily doped than the semiconductor substrate 501 itself and assists in the control of the threshold voltage of the memory cell 500.

A charge-trapping dielectric layer 504 is deposited over the semiconductor substrate 501. The charge-trapping dielectric layer 504 generally can be composed of three separate layers: a first insulating layer 506 in contact with a charge-trapping layer 508, which is in contact with a second insulating layer 510. The first and second insulating layers 506 and 510 may be of an oxide dielectric such as silicon dioxide (SiO₂) and the charge-trapping layer 508 may be of a nitride dielectric such as silicon nitride (Si$_x$N$_y$) to form an ONO layer. Any and all of the layers contain silicon and can be deuterated.

The bitlines, as typified by n-type bitlines 512 and 514, are implanted under the charge-trapping dielectric layer 504 in the semiconductor substrate 501 and a wordline material 515, such as polysilicon, has been deposited over the charge-trapping dielectric layer 504. Again, it will be noted that the present invention is not limited to specific bitline or gate materials. For example, NPN structures are shown but the structures can also be PNP.

The wordline material 515 is patterned, etched, and stripped resulting in wordlines 518 and 519. Spacers 520 and 522 are then formed around the wordlines 518 and 519, respectively, and a salicide layer is deposited to form salicide areas 524 and 526, respectively, on the tops of the respective wordlines 518 and 519. The locations 528 and 530 indicate where bits can be stored in the memory cell 500 and locations 532 and 534 are adjacent locations, which are independent of the memory cell 500.

In another embodiment, the spacers 520 and 522 are composed of silicon-based compounds, such as silicon dioxide, silicon nitride, or silicon oxynitride, and are deuterated. As with the deuterated wordlines 302 in FIG. 3 and the deuterated second insulating layer 410 in FIG. 4, deuterating the spacers 520 and 522 replaces silicon-hydrogen bonds with stronger silicon-deuterium bonds which are less likely to break and result in charge carriers, thus improving data retention.

Figure 6:
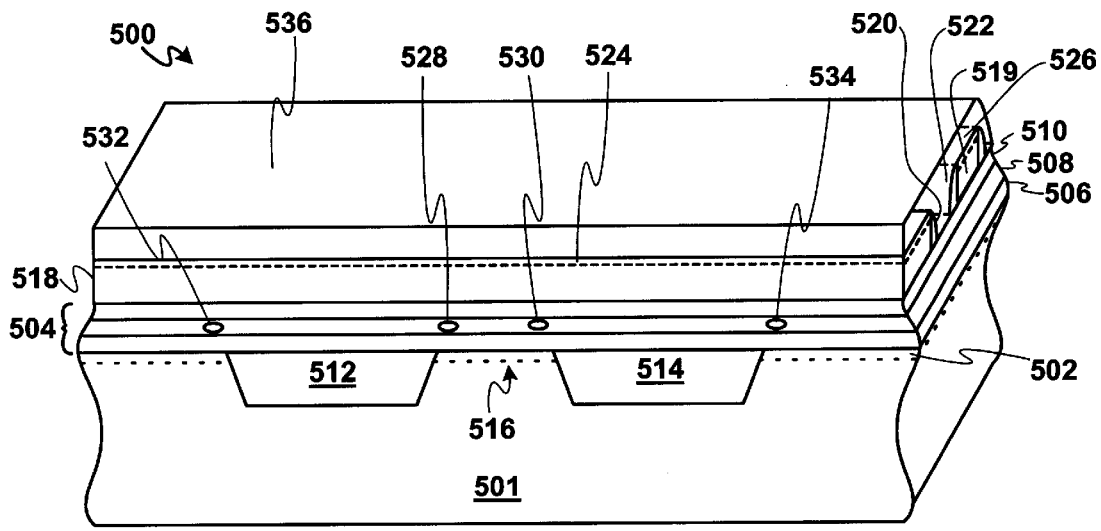
FIG. 6 is a cross-sectional view of a partially processed memory cell similar FIG. 5 including a deuterated interlayer dielectric layer.

Referring now to FIG. 6, therein is shown the structure of FIG. 5 after deposition of the first interlayer dielectric layer 536 over the wordlines 518 and 519. The first interlayer dielectric layer 536 can include a liner (not shown) and be a material such as silicon dioxide or silicon nitride.

In another embodiment, the first interlayer dielectric layer 536 is deuterated. As with the deuterated wordlines 302 in FIG. 3, the deuterated second insulating layer 410 in FIG. 4, and the deuterated spacers 520 and 522 in FIG. 5, the deuterated first interlayer dielectric layer 536 replaces silicon-hydrogen bonds with stronger silicon-deuterium bonds and act as a source of deuterium for the silicon/silicon oxide interface, thus improving data retention.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
    a semiconductor substrate;
    a charge-trapping dielectric layer over the semiconductor substrate;
    first and second bitlines in the semiconductor substrate;
    a wordline over the charge-trapping dielectric layer; and
    a dielectric layer over the wordlines wherein, for a structure selected from at least one of the charge-trapping dielectric layer, the wordline, the interlayer dielectric layer, and a combination thereof, the structure contains deuterium diffused from another structure selected from at least one of the charge-trapping dielectric layer, the wordline, the interlayer dielectric layer, and a combination thereof.

2. The integrated circuit as claimed in claim 1 including the charge-trapping layer, the wordline, the spacer, and the interlayer dielectric layer are of materials selected from silicon oxide, silicon nitride, silicon oxynitride, polysilicon, glass, and a combination thereof.

3. The integrated circuit as claimed in claim 1 wherein the charge-trapping layer, the wordline, the spacer, and the interlayer dielectric layer are of materials selected from a deuterated silicon oxide, a deuterated silicon nitride, a deuterated silicon oxynitride, a deuterated polysilicon, a deuterated glass, and a combination thereof.

4. The integrated circuit as claimed in claim 1 including additional structures in the integrated circuit containing deuterium.

5. An integrated circuit comprising:
   a first dielectric layer on a semiconductor substrate;
   a charge-trapping layer over the first dielectric layer;
   a second dielectric layer over the charge-trapping layer;
   first and second bitlines in the semiconductor substrate;
   a wordline over the second dielectric layer;
   a spacer around the wordline; and
   an interlayer dielectric layer over the wordlines wherein, for a structure selected from at least one of the first dielectric layer, the charge-trapping layer, the second dielectric layer, the wordline, the spacer, the interlayer dielectric layer, and a combination thereof, the structure contains deuterium diffused from another structure selected from least one of the first dielectric layer, the charge-trapping layer, the second dielectric layer, the wordline, the spacer, the interlayer dielectric layer, and a combination thereof.

6. The integrated circuit as claimed in claim 5 wherein the first dielectric layer, the charge-trapping layer, the second dielectric layer, the wordline, the spacer, and the interlayer dielectric layer are of materials selected from silicon oxide, silicon nitride, silicon oxynitride, a polysilicon, glass, and a combination thereof.

7. The integrated circuit as claimed in claim 5 wherein the first dielectric layer, the charge-trapping layer, the second dielectric layer, the wordline, the spacer, and the interlayer dielectric layer are of materials selected from a deuterated silicon oxide, a deuterated silicon nitride, a deuterated silicon oxynitride, a deuterated polysilicon, a deuterated glass, and a combination thereof.

8. The integrated circuit as claimed in claim 5 including additional silicon structures in the integrated circuit containing deuterium.

* * * * *

UNITED STATES PATENT AND TRADEMARK OFFICE
CERTIFICATE OF CORRECTION

PATENT NO. : 6,670,241 B1
DATED : December 30, 2003
INVENTOR(S) : Kamal et al.

It is certified that error appears in the above-identified patent and that said Letters Patent is hereby corrected as shown below:

Column 4,
Line 25, delete "cart" and insert therefore -- can --
Line 37, delete "which" and insert therefore -- with --

Column 8,
Line 3, after "from" insert -- at --

Signed and Sealed this

Twenty-third Day of March, 2004

JON W. DUDAS
*Acting Director of the United States Patent and Trademark Office*